US008599116B2

(12) United States Patent
Mitsuhashi

(10) Patent No.: US 8,599,116 B2
(45) Date of Patent: Dec. 3, 2013

(54) LIGHT-EMITTING DEVICE, METHOD FOR DRIVING THE SAME, AND ELECTRONIC APPARATUS

(75) Inventor: Etsuo Mitsuhashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1245 days.

(21) Appl. No.: 11/684,921

(22) Filed: Mar. 12, 2007

(65) Prior Publication Data

US 2007/0215888 A1 Sep. 20, 2007

(30) Foreign Application Priority Data

Mar. 15, 2006 (JP) ................................. 2006-070691

(51) Int. Cl.
*G09G 3/30* (2006.01)
*G09G 3/36* (2006.01)

(52) U.S. Cl.
USPC ................................ 345/77; 345/76; 345/101

(58) Field of Classification Search
USPC ............. 345/101, 76–84, 204–215, 690–699; 315/169.1–169.4
See application file for complete search history.

(56) References Cited

U.S. PATENT DOCUMENTS

| 6,518,941 | B1 | 2/2003 | Kimura |
| 7,236,164 | B2 | 6/2007 | Kimura |
| 7,282,855 | B2 * | 10/2007 | Park et al. .................. 313/506 |
| 2003/0214467 | A1 | 11/2003 | Koyama et al. |
| 2004/0070558 | A1 * | 4/2004 | Cok et al. ....................... 345/76 |
| 2004/0150594 | A1 | 8/2004 | Koyama et al. |
| 2005/0017963 | A1 * | 1/2005 | Yamazaki et al. ............. 345/204 |
| 2005/0167833 | A1 * | 8/2005 | Kobayashi et al. ............ 257/738 |
| 2006/0082523 | A1 * | 4/2006 | Guo et al. ........................ 345/76 |
| 2009/0237390 | A1 | 9/2009 | Koyama et al. |

FOREIGN PATENT DOCUMENTS

| JP | A-11-73158 | 3/1999 |
| JP | A 2001-035655 | 2/2001 |
| JP | A-2002-175046 | 6/2002 |
| JP | A-2002-229513 | 8/2002 |
| JP | A 2002-278514 | 9/2002 |
| JP | A 2003-150113 | 5/2003 |
| JP | A-2003-308046 | 10/2003 |
| JP | A-2003-330419 | 11/2003 |
| JP | A-2004-70349 | 3/2004 |
| JP | A-2005-208228 | 8/2005 |

* cited by examiner

*Primary Examiner* — Alexander Eisen
*Assistant Examiner* — Patrick F Marinelli
(74) *Attorney, Agent, or Firm* — Oliff and Berridge, PLC

(57) ABSTRACT

A light-emitting device includes a plurality of pixels, a temperature-detection pixel, a temperature detector, an applied-current calculator, and a current applying unit disposed on a substrate. The pixels include display light-emitting elements for displaying information. The temperature-detection pixel is provided within a display area where the pixels are disposed and includes a temperature-detection light-emitting element for temperature detection, which is shielded by a light shielding layer and includes the same organic layer as that included in each display light-emitting element. The temperature detector detects a current value of the temperature-detection light-emitting element so as to detect the temperature thereof. The applied-current calculator calculates an electric current to be applied to the display light-emitting elements in accordance with the detected temperature so that the display light-emitting elements emit light with a predetermined luminance. The current applying unit applies the electric current to the display light-emitting elements.

8 Claims, 9 Drawing Sheets

LIGHT-EMITTING DEVICE, METHOD FOR DRIVING THE SAME, AND ELECTRONIC APPARATUS

BACKGROUND

1. Technical Field

The present invention relates to light-emitting devices, such as organic electroluminescence (EL) panels, methods for driving such light-emitting devices, and electronic apparatuses equipped with such light-emitting devices.

2. Related Art

It is generally known that organic EL materials used for light-emitting elements in organic EL panels, which are an example of light-emitting devices, are problematic in that the brightness varies depending on the ambient temperature due to the unique temperature characteristics of the materials. Especially in RGB-independent-emission panels, the differences in the unique temperature characteristics of the materials can induce a color shift, which significantly lowers the display quality. The term "color shift" refers to a change (shift) in the current-versus-light output characteristic caused by temperature differences occurring within a substrate plane (that is, among pixels in the central region and pixels in the periphery regions), a change (shift) in the current-versus-light output characteristic caused by different temperature characteristics among R, G, and B, or a change (shift) in the current-versus-light output characteristic caused by heat generated by TFTs or peripheral circuits (wiring). JP-A-2001-3565D discloses an example of a technique for solving this problem, in which measurement EL elements are provided as temperature sensors for measuring the temperature of the organic EL panel. In this technique, a drive waveform to be applied to the organic EL elements is corrected on the basis of the measured temperature.

With the technique disclosed in JP-A-2001-35655, however, the temperature sensors are disposed in areas other than the display area of the substrate on which the light-emitting elements are disposed. This is technically problematic in that it is difficult to measure the temperature of the light-emitting elements with high accuracy. Supposedly, if the temperature sensors are to be disposed within the display area of the substrate, the substrate may unfavorably need to be given a complicated structure, such as a multilayer structure, or the aperture ratio of the display area may undesirably become reduced. In particular, providing a temperature sensor in the central region of the substrate is not only difficult in terms of circuit wiring, but can also cause heat generation and heat radiation by the wiring lines. On the other hand, setting the sensors externally to the luminescence panel will not make the most of the advantages of organic EL panels, such as compact, low-profile, and lightweight features.

SUMMARY

An advantage of some aspects of the invention is that it provides a light-emitting device that can detect the temperature in a display area of the light-emitting device so as to achieve high-quality image display with no occurrence of color shifts, a method for driving such a light-emitting device, and an electronic apparatus equipped with such a light-emitting device.

According to a first aspect of the invention, a light-emitting device is provided, which includes a substrate, a plurality of pixels disposed on the substrate, a temperature-detection pixel disposed on the substrate and provided in a display area in which the plurality of pixels are disposed, a temperature detector disposed on the substrate, an applied-current calculator disposed on the substrate, and a current applying unit disposed on the substrate. The pixels include display light-emitting elements for displaying information. The temperature-detection pixel includes a temperature-detection light-emitting element used for temperature detection, the temperature-detection light-emitting element being shielded by a light shielding layer and including an organic layer that is the same as an organic layer included in each display light-emitting element. The temperature detector detects a current value of the temperature-detection light-emitting element so as to detect the temperature of the temperature-detection light-emitting element. The applied-current calculator calculates an electric current to be applied to the display light-emitting elements in accordance with the temperature detected by the temperature detector so that the display light-emitting elements emit light with a predetermined luminance. The current applying unit applies the electric current to the display light-emitting elements.

In the light-emitting device according to the first aspect of the invention, when the device is in operation, the display light-emitting elements, such as organic EL elements, in the pixels receive an electric current so that light is emitted from the organic layers, such as organic EL layers, in the display light-emitting elements. Thus, information can be displayed in the display area. In this case, the luminance of the pixels is controlled on the basis of the applied current. When the device is in operation, heat generated as a result of light emission by the display light-emitting elements or heat generated by wiring resistors or semiconductor elements, such as thin film transistors (TFTs), provided in the pixels may possibly cause the temperature of the pixels to change. The display light-emitting elements have a temperature characteristic in which the luminance thereof varies with respect to an applied current depending on the temperature at which the display light-emitting elements are used. This implies that the luminance of the pixels may possibly vary in response to a temperature change in the pixels.

In the first aspect of the invention, the temperature-detection pixel including the temperature-detection light-emitting element used for temperature detection is provided in the display area.

The temperature-detection light-emitting element includes an organic layer that is the same as an organic layer included in each display light-emitting element. Specifically, this means that the organic layers are of the same kind and are formed at the same time in the manufacturing process. Moreover, the temperature-detection light-emitting element is shielded by a light shielding layer. In other words, the temperature-detection pixel including the temperature-detection light-emitting element is a non-light-emitting pixel that does not contribute to the display in the display area. Generally, the temperature-detection pixel is formed by providing a light shielding layer in at least one of the plurality of pixels that include the display light-emitting elements.

Furthermore, in the first aspect of the invention, the temperature detector detects a current value of the temperature-detection light-emitting element included in the temperature-detection pixel so as to detect the temperature of the temperature-detection light-emitting element. Specifically, the temperature detector detects the temperature of the temperature-detection light-emitting element by utilizing the temperature characteristic of the temperature-detection light-emitting element. In other words, the temperature-detection light-emitting element functions as a temperature sensor for detecting the temperature of the pixels on the substrate. In this case, the term "temperature characteristic of the temperature-detection light-emitting element" refers to a characteristic in which a voltage required for applying a predetermined current to the temperature-detection light-emitting element changes in response to a temperature change. For example, the temperature characteristic can be expressed by, for example, an amount of voltage change per unit temperature required for applying a predetermined current to the temperature-detection light-emitting element.

The temperature detector implements the temperature detection by, for example, applying a predetermined voltage, which is appropriate for a temperature range to be detected, to the temperature-detection light-emitting element and then detecting the current value. In this case, even though light is emitted from the organic layer included in the temperature-detection light-emitting element, since the temperature-detection light-emitting element is shielded by the light shielding layer as mentioned above, the light has substantially no adverse effect or has absolutely no adverse effect on the display in the display area. Furthermore, since the organic layer is shielded by the light shielding layer, a minute electric current generated by light excitation occurring from external light is substantially or entirely prevented from flowing into the organic layer, thereby allowing for temperature monitoring with higher accuracy.

Accordingly, the temperature of the temperature-detection light-emitting element (or namely, the temperature of the pixels on the substrate) can be detected by utilizing the temperature characteristic of the temperature-detection light-emitting element in the temperature-detection pixel provided in the display area. Therefore, unlike a case where the temperature of the pixels is detected by, for example, a temperature sensor disposed in an area other than the display area, the temperature of the pixels can be detected in an area much closer to the pixels (more specifically, the light-emitting elements). Accordingly, the temperature of the pixels can be detected with higher accuracy.

Furthermore, as described above, the temperature-detection light-emitting element includes an organic layer that is the same as the organic layer included in each display light-emitting element, and the temperature-detection pixel is generally formed by providing a light shielding layer in at least one of the plurality of pixels that include the display light-emitting elements. Accordingly, unlike a case where a temperature sensor for temperature detection is provided separate from the pixels, a complicated manufacturing process is substantially not necessary.

In addition, in the first aspect of the invention, the applied-current calculator calculates an electric current to be applied to the display light-emitting elements in accordance with the temperature detected by the temperature detector so that the display light-emitting elements emit light with a predetermined luminance. Moreover, the current applying unit applies the calculated current to the display light-emitting elements. In other words, the display light-emitting elements receive an electric current that has been corrected to allow the display light-emitting elements to emit light with the predetermined luminance at the detected temperature. Accordingly, the luminance of the pixels can be controlled to a desired level in accordance with the detected temperature. This implies that luminance variation or deviation of the luminance from a desired level resulting from a temperature change in the display light-emitting elements can be reduced or prevented, thereby allowing for high-quality image display.

As described above, in the light-emitting device according to the first aspect of the invention, the temperature of the temperature-detection light-emitting element provided in the display area is detected, and the electric current corrected in accordance with the detected temperature is applied to the display light-emitting elements, whereby high-quality image display can be achieved. In particular, since the temperature detector detects the temperature of the temperature-detection light-emitting element by utilizing the temperature characteristic of the temperature-detection light-emitting element provided in the display area, the temperature detection can be implemented within the display area, and a complicated manufacturing process is substantially not necessary.

Furthermore, in the light-emitting device according to the first aspect of the invention, it is preferable that the display light-emitting elements include three kinds of display light-emitting elements respectively having three kinds of organic layers that emit red, green, and blue light rays. Moreover, the temperature-detection light-emitting element preferably includes three kinds of temperature-detection light-emitting elements respectively having three kinds of organic layers that are the same as the three kinds of organic layers included in the three kinds of display light-emitting elements. In this case, the temperature detector detects the temperature of each of the three kinds of temperature-detection light-emitting elements, and the applied-current calculator calculates the electric current to be applied to each of the three kinds of display light-emitting elements.

Accordingly, this can reduce or prevent color shifts that can occur in RGB-independent-emission panels due to differences in temperature among pixels in the central region and pixels in periphery regions of the panel. Specifically, the temperatures of the R, G, and B pixels are detected accurately and are fed back for the calculation of the electric currents to be applied to the R, G, and B pixels, thereby reducing or preventing color shifts occurring from differences in temperature.

Furthermore, in the light-emitting device according to the first aspect of the invention, it is preferable that the temperature-detection light-emitting element contain an organic material having a temperature characteristic of 5 mV/° C. or higher.

Accordingly, since the current fluctuation in the temperature-detection light-emitting element is large against a temperature change, the temperature detector can readily detect the temperature of the temperature-detection light-emitting element. Specifically, this allows the temperature-detection light-emitting element to readily function as a temperature sensor. Here, the term "temperature characteristic of 5 mV/° C." means that an amount of voltage change per unit temperature required for applying a predetermined current is 5 mV.

Furthermore, in the light-emitting device according to the first aspect of the invention, it is preferable that the temperature detector detect the current value of the temperature-detection light-emitting element by applying a predetermined voltage thereto.

Accordingly, the current-value detect on can be accurately implemented by applying a predetermined voltage, which is appropriate for a temperature range to be detected, to the temperature-detection light-emitting element and then detecting the current value. Thus, the temperature of the temperature-detection light-emitting element can be detected accurately.

Furthermore, in the light-emitting device according to the first aspect of the invention, it is preferable that the temperature-detection pixel include a plurality of temperature-detection pixels disposed at various locations within the display area. In this case, the temperature detector detects the temperature of the temperature-detection light-emitting element included in each of the plurality of temperature-detection pixels.

Accordingly, the temperature-detection pixels can be located in, for example, at least one of the central section and the periphery sections of the display area. This allows for the detection of various temperatures in the display area, or more specifically, a temperature distribution of the plurality of pixels in the display area, thereby reducing or preventing brightness variation in the display area. This is especially effective when the display area is large or the luminescence panel is large in size.

According to a second aspect of the invention, an electronic apparatus is provided, which includes the light-emitting device according to the first aspect of the invention.

Because this electronic apparatus according to the second aspect of the invention includes the light-emitting device according to the first aspect of the invention, the electronic apparatus is capable of achieving high quality display regardless of the ambient temperature. Examples of such a high-quality display electronic apparatus include portable apparatuses, such as portable telephones and electronic notepads, projection display apparatuses, word processors, viewfinder-type or monitor-direct-view-type video tape recorders, workstations, videophones, point-of-sale (POS) terminals, touch panels, and image formation apparatuses equipped with the light-emitting device as an exposure head, such as printers, copiers, and facsimile apparatuses. Moreover, the electronic apparatus according to the second aspect of the invention is also applicable to display portions used in instrument panels or to in-vehicle car navigation systems that require high reliability.

According to a third aspect of the invention, a method for driving a light-emitting device is provided, in which the light-emitting device includes a substrate; a plurality of pixels disposed on the substrate, the pixels including display light-emitting elements for displaying information; a temperature-detection pixel disposed on the substrate, the temperature-detection pixel being provided in a display area in which the plurality of pixels are disposed and including a temperature-detection light-emitting element used for temperature detection, the temperature-detection light-emitting element being shielded by a light shielding layer and including an organic layer that is the same as an organic layer included in each display light-emitting element. The method includes detecting a current value of the temperature-detection light-emitting element so as to detect the temperature of the temperature-detection light-emitting element; calculating an electric current to be applied to the display light-emitting elements in accordance with the detected temperature so that the display light-emitting elements emit light with a predetermined luminance; and applying the electric current to the display light-emitting elements.

Similar to the light-emitting device according to the first aspect of the invention, in the method according to the third aspect of the invention, the temperature of the temperature-detection light-emitting element provided within the display area is detected so that the display light-emitting elements can receive an electric current that has been corrected in accordance with the detected temperature. Accordingly, this allows for high-quality image display.

Other features and advantages of the invention will become more apparent from the following detailed description of preferred embodiments of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention will now be described with reference to the drawings. The embodiments below are directed to an organic electroluminescence (EL) device as an example of a light-emitting device.

First Embodiment

An organic EL device and a method for driving the device according to a first embodiment of the invention will be described below with reference to FIGS. 1 to 7.

Figure 1:
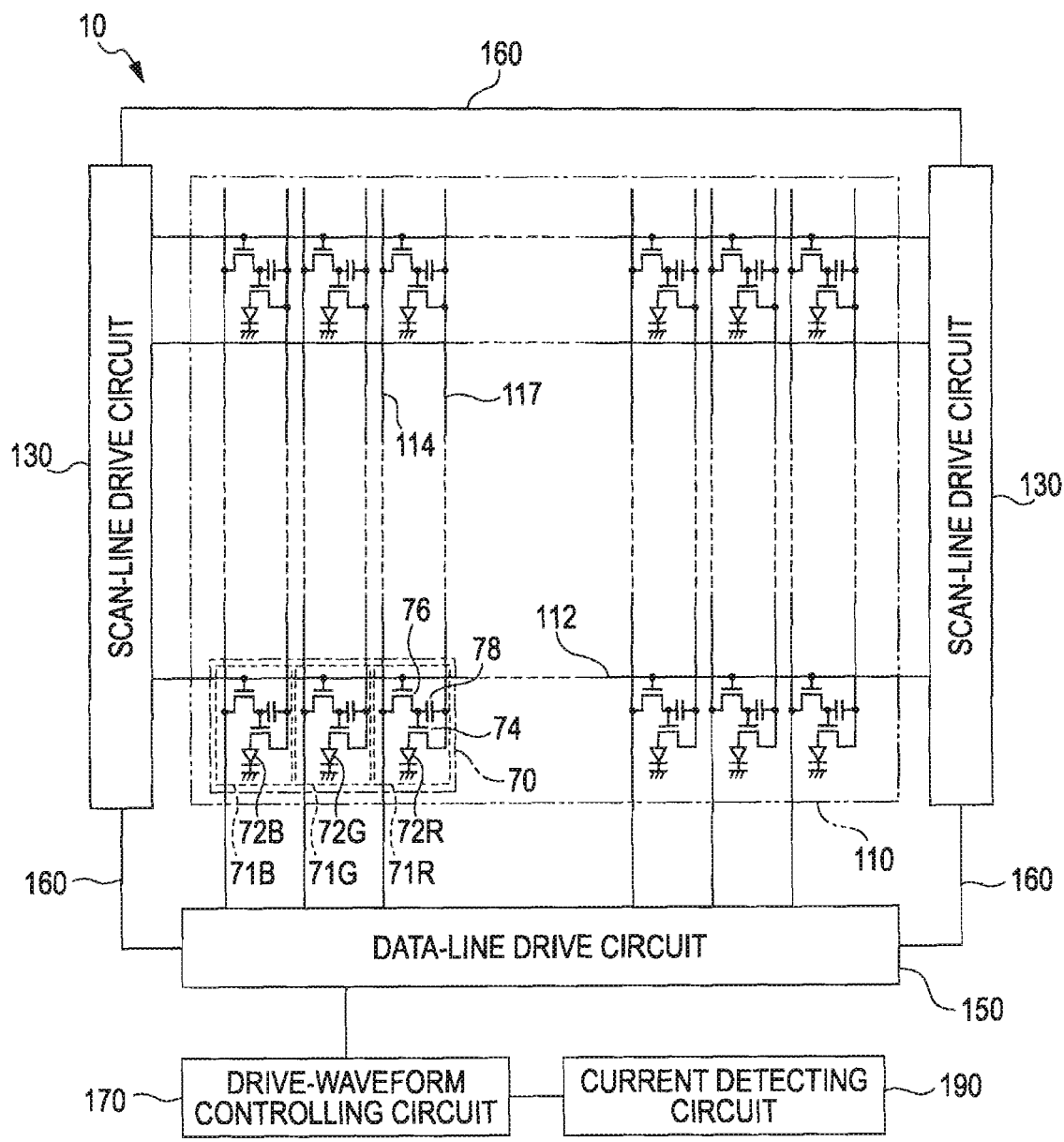
FIG. 1 is a block diagram showing an overall structure of an organic EL device according to a first embodiment.

An overall structure of the organic EL device according to the first embodiment will be described first with reference to FIG. 1. FIG. 1 is a block diagram showing the overall structure of the organic EL device according to the first embodiment.

In FIG. 1 an organic EL device 10 is a display device having built-in drive circuits and driven on the basis of an active matrix driving system. The organic EL device 10 includes pixels 70, each of which is constituted by subpixels 71R, 71G, and 71B.

The organic EL device 10 has an image display area 110 in which data lines 114 and scan lines 112 are arranged in vertical and horizontal directions, respectively. The subpixels 71R, 71G, and 71B correspond to the intersection points of the data lines 114 and scan lines 112 and are arranged in a matrix. A set of three subpixels 71R, 71G, and 71B constitutes one pixel 70. As will be described later, the subpixels 71R, 71G and 71B emit light rays having wavelengths for red (R), green (G), and blue (B) colors, respectively. Thus, the organic EL device 10 can display full-color images by controlling the pixels 70 through scan-line drive circuits 130 and a data-line drive circuit 150.

Furthermore, the image display area 110 has power supply lines 117 that are arranged relative to the data lines 114 and correspond to the subpixels 71R, 71G, and 71B.

The image display area 110 has temperature-detection pixels, which will be described later. Specifically, some of the pixels 70 in the image display area 110 are provided with light shielding layers so as to function as temperature-detection pixels.

A peripheral area surrounding the image display area 110 is provided with the scan-line drive circuits 130, the data-line drive circuit 150, a drive-waveform controlling circuit 170, and a current detecting circuit 190. The scan-line drive circuits 130 sequentially send scan signals to the plurality of scan lines 112. The current detecting circuit 190 is capable of detecting current values of temperature-detection organic EL elements provided in the temperature-detection pixels. The current detecting circuit 190 outputs the detected current values to the drive-waveform controlling circuit 170. Based on the current values detected by the current detecting circuit 190, the drive-waveform controlling circuit 170 calculates the temperatures of the temperature-detection organic EL elements provided in the temperature-detection pixels, and generates correction data on the basis of the calculated temperatures. The correction data is then output to the data-line drive circuit 150. Based on the correction data and display data from the drive-waveform controlling circuit 170, the data-line drive circuit 150 generates a drive waveform for driving the pixels 70 and sends the drive waveform to the data lines 114 arranged in the image display area 110. The scan-line drive circuits 130 and the data-line drive circuit 150 operate in synchronization with each other by means of synchronization signal lines 160.

The power supply lines 117 receive pixel-driving power from an external circuit. Referring to FIG. 1, in each of the pixels 70, the subpixels 71R, 71G, and 71B are respectively provided with organic EL elements 72R, 72G, and 72B. Moreover, each of the subpixels 71R, 71G, and 71B is also provided with a switching transistor 76 and a driving transistor 74 formed of TFTs, and a hold capacitor 78. Each switching transistor 76 has a gate electrode electrically connected to the corresponding scan line 112, a source electrode electrically connected to the corresponding data line 114, and a drain electrode electrically connected to a gate electrode of the corresponding driving transistor 74. A drain electrode of each driving transistor 74 is electrically connected to the corresponding power supply line 117, and a source electrode of each driving transistor 74 is electrically connected to an anode of the corresponding organic EL element 72.

Alternative examples of the pixel circuit shown in FIG. 1 include a current-programmed pixel circuit, a voltage-programmed pixel circuit, a voltage comparator pixel circuit, and a subframe-type pixel circuit.

Figure 2:
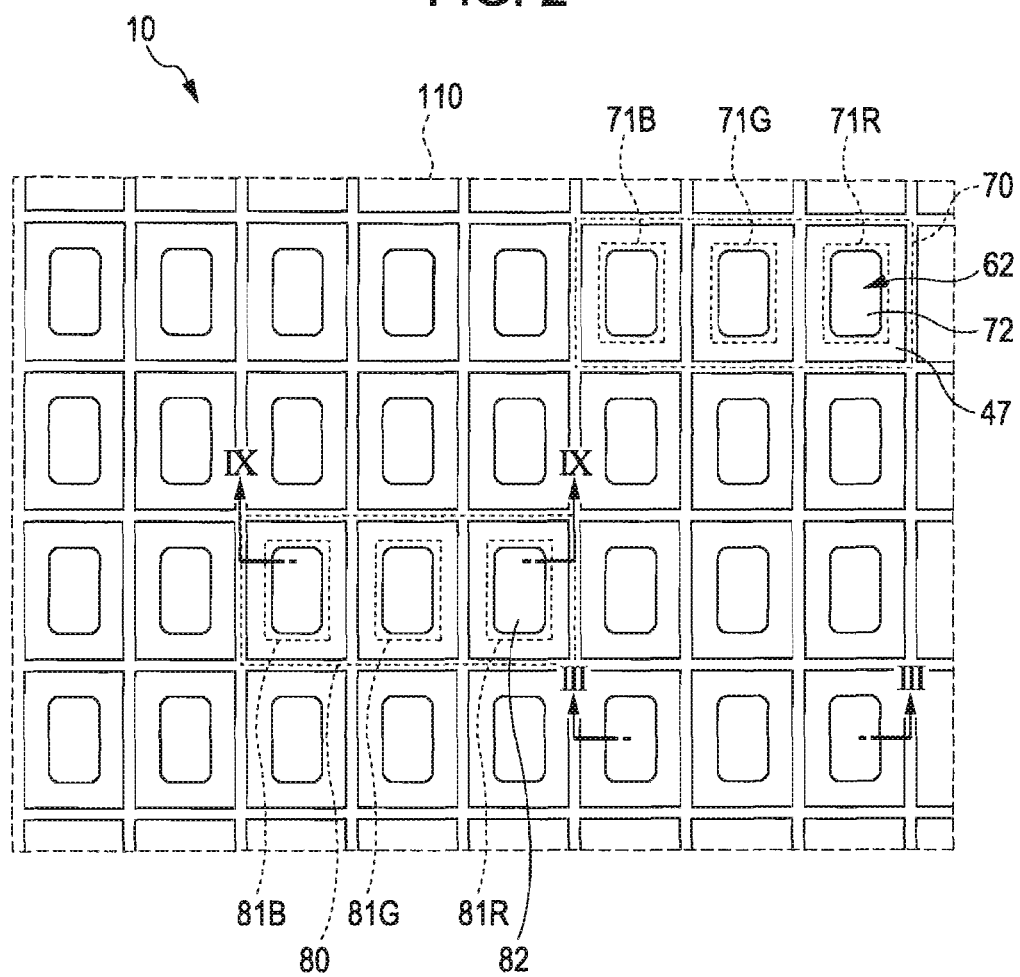
FIG. 2 is a schematic plan view of the organic EL device according to the first embodiment.
Figure 3:
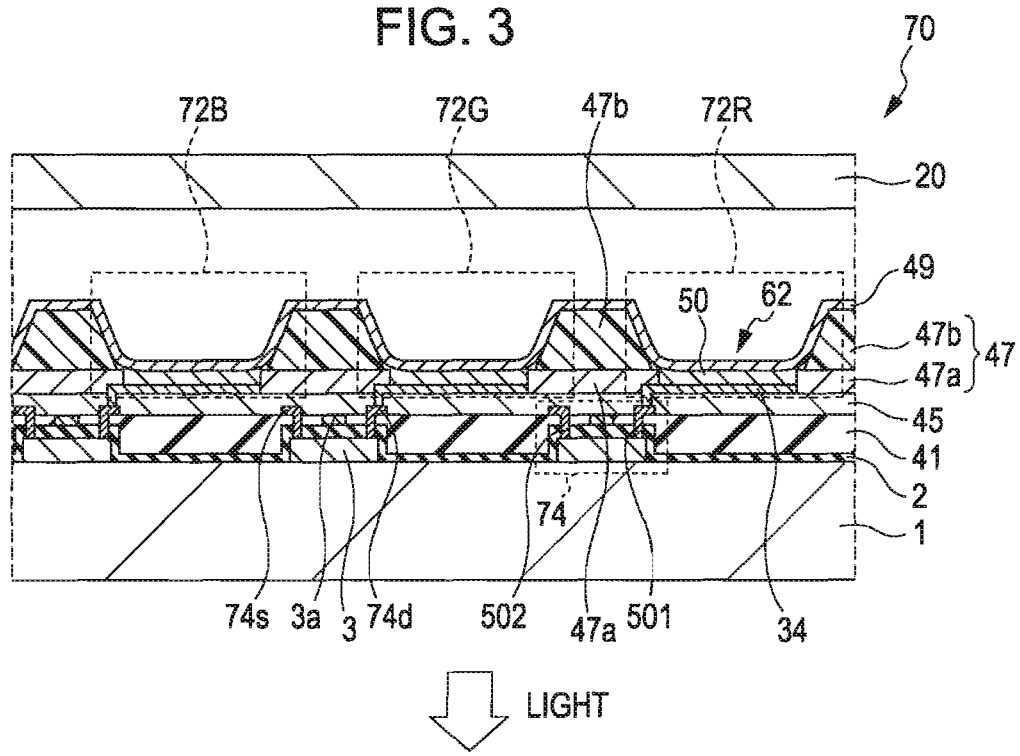
FIG. 3 is a cross-sectional view taken along line III-III in FIG. 2.
Figure 4:
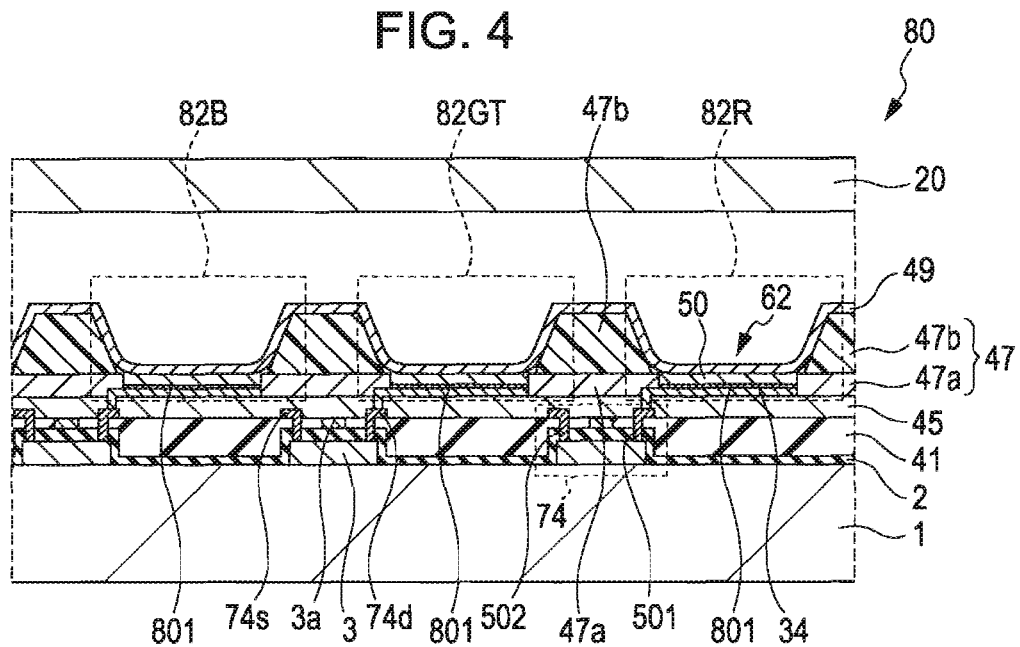
FIG. 4 is a cross-sectional view taken along line IX-IX in FIG. 2.

The structure of the organic EL device according to the first embodiment will be described in more detail with reference to FIGS. 2 to 4. FIG. 2 is a schematic plan view of the organic EL device. FIG. 3 is a cross-sectional view taken along line III-III in FIG. 2. FIG. 4 is a cross-sectional view taken along line IX-IX in FIG. 2.

Referring to FIG. 2, the organic EL device 10 includes the plurality of pixels 70 and temperature-detection pixels 80 within the image display area 110.

Referring to FIGS. 2 and 3, the pixels 70 are arranged in a matrix in the image display area 110 on a substrate 1. Each pixel 70 is constituted by a set of three subpixels 71R, 71G, and 71B that are arranged in the horizontal direction of the drawing. The pixels 70 are arranged within the image display area 110 in the vertical and horizontal directions of the drawing. Each of the subpixels 71 has a recess 62 surrounded by a partition bank 47. In each recess 62, an organic EL element 72 serving as a display light-emitting element is provided.

Referring to FIGS. 2 and 4, the temperature-detection pixels 80 are provided as part of the pixels 70 arranged in a matrix in the image display area 110. In FIG. 4, one of the temperature-detection pixels 80 is shown. The temperature-detection pixels 80 have substantially the same configuration as the pixels 70, and are each constituted by a set of three subpixels 81R, 81G, and 81B arranged in the horizontal direction of the drawing. Each of the subpixels 81 has a recess 62 surrounded by a partition bank 47. In the recesses 62 of the subpixels 81, organic EL elements 82R, 82GT, and 82B having substantially the same configuration as the organic EL elements 72 are provided as non-light-emitting pixel sections. As will be described later with reference to FIG. 7, the subpixels 81 are also provided with organic EL elements 83R, 83G, and 83B that serve as display light-emitting elements.

The pixels 70 and the temperature-detection pixels 80 will be described below in further detail.

Referring to FIG. 3, each pixel 70 is interposed between the substrate 1 and a sealing plate 20, and includes the organic EL elements 72 (that is, the organic EL elements 72R, 72G, and 72B), the driving transistors 74, and the partition banks 47.

The substrate 1 is composed of, for example, glass. The substrate 1 does not only have the organic EL elements 72 disposed thereon, but also holds various kinds of circuits that are shown in FIG. 1, such as the scan-line drive circuits 130, the data-line drive circuit 150, and the drive-waveform controlling circuit 170. These circuits are disposed in the aforementioned peripheral area that surrounds the image display area 110 of the substrate 1.

Each organic EL element 72 is constituted by an organic EL layer 50, a cathode 49, and an anode 34.

Each organic EL layer 50 is formed by applying an organic material, by an ink jet technique, onto the recess 62 surrounded by the partition bank 47 that functions as an element isolator for isolating the organic EL layer 50 from the other organic EL layers 50. More specifically, the organic EL layers 50 are formed by selectively coating the recesses 62 in the corresponding subpixels 71 with an organic EL material for emitting red light, an organic EL material for emitting green light, and an organic EL material for emitting blue light. In other words, each organic EL element 72R has an organic EL layer 50 composed of an organic EL material for emitting red light, each organic EL element 72G has an organic EL layer 50 composed of an organic EL material for emitting green light, and each organic EL element 72B has an organic EL layer 50 composed of an organic EL material for emitting blue light.

Each partition bank 47 includes a first bank portion 47a and a second bank portion 47b. The partition banks 47 define the recesses 62 in which the organic EL layers 50 are formed. Each first bank portion 47a is defined by an inorganic layer composed of an inorganic materials such as SiO, $SiO_2$, and $TiO_2$, and is formed on a protective layer 45 by means of a layer forming technique, such as CVD (chemical vapor deposition), coating, and sputtering. On the other hand, each second bank portion 47b is defined by an organic layer composed of an organic material, such as acrylic resin and polyimide resin, and is tapered in the upward direction of the drawing. The second bank portions 47b are formed by forming an organic layer over the first bank portions 47a and then patterning the organic layer by, for example, photolithography. Each second bank portion 47b is formed such that its bottom is smaller than the first bank portion 47a in the horizontal direction of the drawing.

Of a gate insulating layer 2, an insulating interlayer 41, the protective layer 45, and the first bank portions 47a that are stacked in that order on the substrate 1, the anodes 34 are embedded in the first bank portions 47a. Each of the anodes 34 is defined by a transparent electrode composed of a transparent material, such as indium tin oxide (ITO), which can transmit light emitted from the organic EL layer 50 in the downward direction of the drawing. Consequently, the organic EL device 10 is of a bottom-emission type. Alternatively, the organic EL device may be of a top-emission type that can emit light towards the sealing plate 20.

The cathode 49 is formed of a common layer disposed over the subpixels 71R, 71G, and 71B so as to face the anodes 34 across the organic EL layers 50. More specifically, the cathode 49 covers the top surfaces of the second bank portions 47b, which isolate the subpixels 71 from one another, and also covers the top surfaces of the organic EL layers 50 so as to serve as a common electrode shared by the organic EL elements 72R, 72G, and 72B respectively included in the subpixels 71R, 71G, and 71B. The cathode 49 is composed of a thin metallic film of, for example, aluminum so that light emitted upward from the organic EL layers 50 can be reflected downward.

Each driving transistor 74 has a source electrode 74s that is electrically connected to the corresponding power supply line 117 shown in FIG. 1, and also has a drain electrode 74d that is electrically connected to the corresponding anode 34. The driving transistors 74 are turned on and off in accordance with data signals supplied to gate electrodes 3a via the data lines 114 shown in FIG. 1, and sends driving currents to the organic EL elements 72. Circuits that include such elements are disposed away from the underside of the organic EL layers 50 so as not to block the light emitted from the organic EL layers 50 towards the substrate 1. Furthermore, similar to the driving transistors 74, the switching transistors 76 shown in FIG. 1 are also provided on the substrate 1.

Semiconductor layers 3 are polycrystalline silicon layers or amorphous silicon layers formed by employing a low-temperature polysilicon technique. The gate insulating layer 2 for the driving transistors 74 and the switching transistors 76 are disposed over the semiconductor layers 3 so as to encompass the semiconductor layers 3. The gate electrodes 3a of the driving transistors 74 and the scan lines 112 shown In FIG. 1 are disposed on the gate insulating layer 2. Sections of the scan lines 112 serve as gate electrodes for the switching transistors 76. The gate electrodes 3a and the scan lines 112 are composed of a metallic material that contains at least one of the following: aluminum (Al), tungsten (W), tantalum (Ta), molybdenum (Mo), titanium (Ti), copper (Cu), and chromium (Cr).

The insulating interlayer 41 is disposed over the gate insulating layer 2 so as to encompass the scan lines 112 and the gate electrodes 3a of the driving transistors 74. The insulating interlayer 41 and the gate insulating layer 2 are formed of, for example, a silicon dioxide film. Above the insulating interlayer 41 are disposed the data lines 114 and the power supply lines 117, which are composed of a conductive material containing, for example, aluminum (Al) or ITO, and the source electrodes 74s of the driving transistors 74. The insulating interlayer 41 has contact holes 501 and 502 which extend from the top surface of the insulating interlayer 41 to the semiconductor layers 3 in the driving transistors 74 through the insulating interlayer 41 and the gate insulating layer 2. The conductive films that form the power supply lines 117 and the drain electrodes 74d continuously extend to the top surfaces of the semiconductor layers 3 along the inner surfaces of the contact holes 501 and 502. The insulating interlayer 41 has the protective layer 45 disposed thereon, which encompasses the power supply lines 117 and the drain electrodes 74d. The protective layer 45 is formed of, for example, a silicon nitride ($SiN_x$) film or a silicon oxide film ($SiO_x$). The protective layer 45 has the first bank portions 47a formed of, for example, silicon oxide films disposed thereon, and moreover, the first bank portions 47a have the second bank portions 47b thereon. The first bank portions 47a and the second bank portions 47b define the areas in which the organic EL layers 50 are formed in each pixel.

The sealing plate 20 is composed of, for example, glass or plastic, and prevents moisture from entering the organic EL layers 50 from the exterior of the organic EL device 10. More specifically, the sealing plate 20 is adhered above the substrate 1 with an adhesive and seals the organic EL elements 72 so as to prevent them from being exposed to air. For example, the sealing plate 20 is adhered and sealed to the substrate 1 by applying an adhesive around the periphery section of the sealing plate 20 using an applying unit, such as a disperser. Accordingly, this reduces deterioration of the organic EL elements 72 caused by, for example, moisture in the air, thereby contributing to a longer life of the organic EL device 10.

Referring to FIG. 4, the temperature-detection pixels 80 have substantially the same configuration as the pixels 70 described above with reference to FIG. 3. Therefore, descriptions related to the same configuration as the pixels 70 will not be repeated below, and the features of the temperature-detection pixels 80 that are different from those of the pixels 70 will be described below.

Each of the temperature-detection pixels 80 is constituted by the subpixels 81R, 81G, and 81B (see FIG. 2). The subpixels 81R, 81G, and 81B respectively Include the organic EL elements 82R, 82GT, and 82B. The organic EL elements 82R, 82GT, and 82B include the same organic EL layers as the organic EL layers 50 included in the organic EL elements 72. In other words, like the organic EL elements 72, the organic EL elements 82 include the organic EL layers 50. More specifically, each organic EL element 82R has an organic EL layer 50 composed of an organic EL material for emitting red light, each organic EL element 82GT has an organic EL layer 50 composed of an organic EL material for emitting green light, and each organic EL element 82B has an organic EL layer 50 composed of an organic EL material for emitting blue light.

The organic EL elements 82R, 82GT, and 82B in the temperature-detection pixels 80 are each provided with a light shielding layer 801 formed of, for example, a conductive film that has a light shielding effect. Each light shielding layer 801 prevents the light emitted from the corresponding organic EL layer 50 from being transmitted in the downward direction of the drawing.

Specifically, in each temperature-detection pixel 80, the sections where the organic EL elements 82R, 82GT, and 82B are disposed serve as non-light-emitting pixel sections that do not contribute to the display, whereas the sections where the organic EL elements 83R, 83G, and 83B are disposed (which will be described later with reference to FIG. 7) serve as light-emitting pixel sections that contribute to the display. In other words, each of the temperature-detection pixels 80 has light-emitting pixel sections and non-light-emitting pixel sections.

Figure 5:
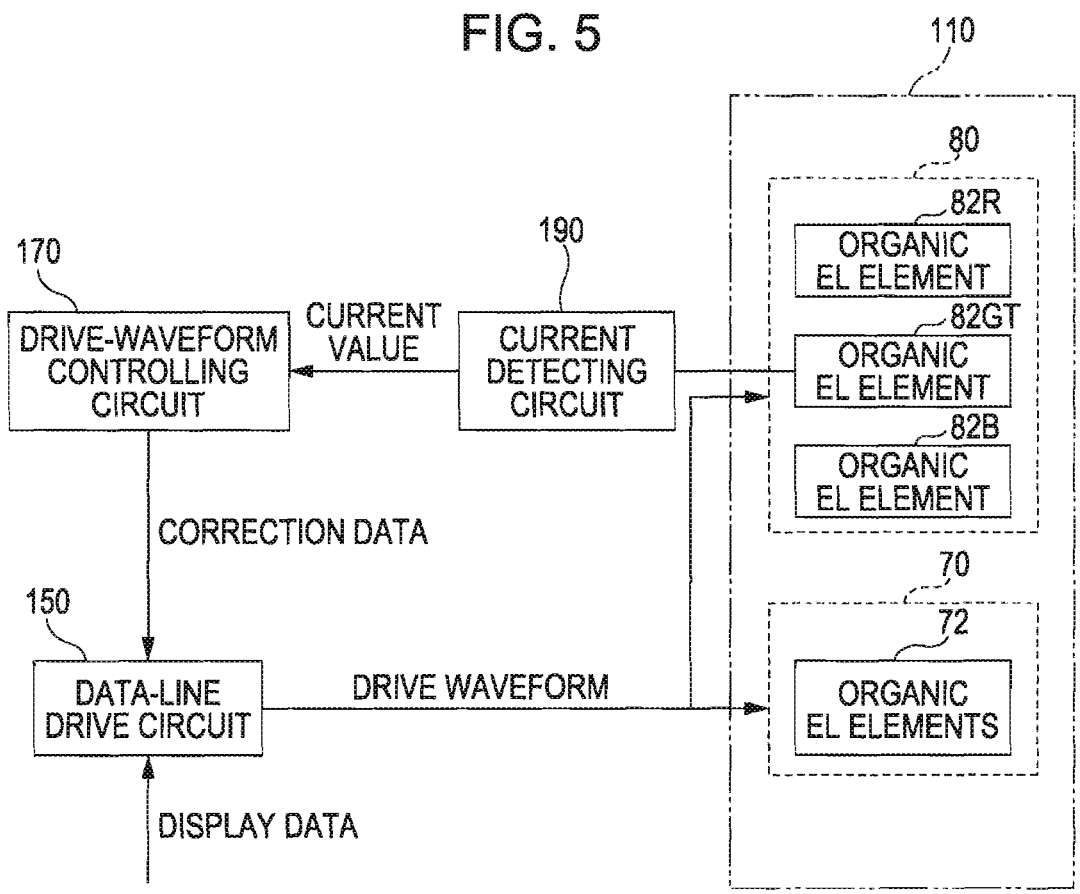
FIG. 5 is a block diagram illustrating a method for driving the organic EL device according to the first embodiment.
Figure 6:
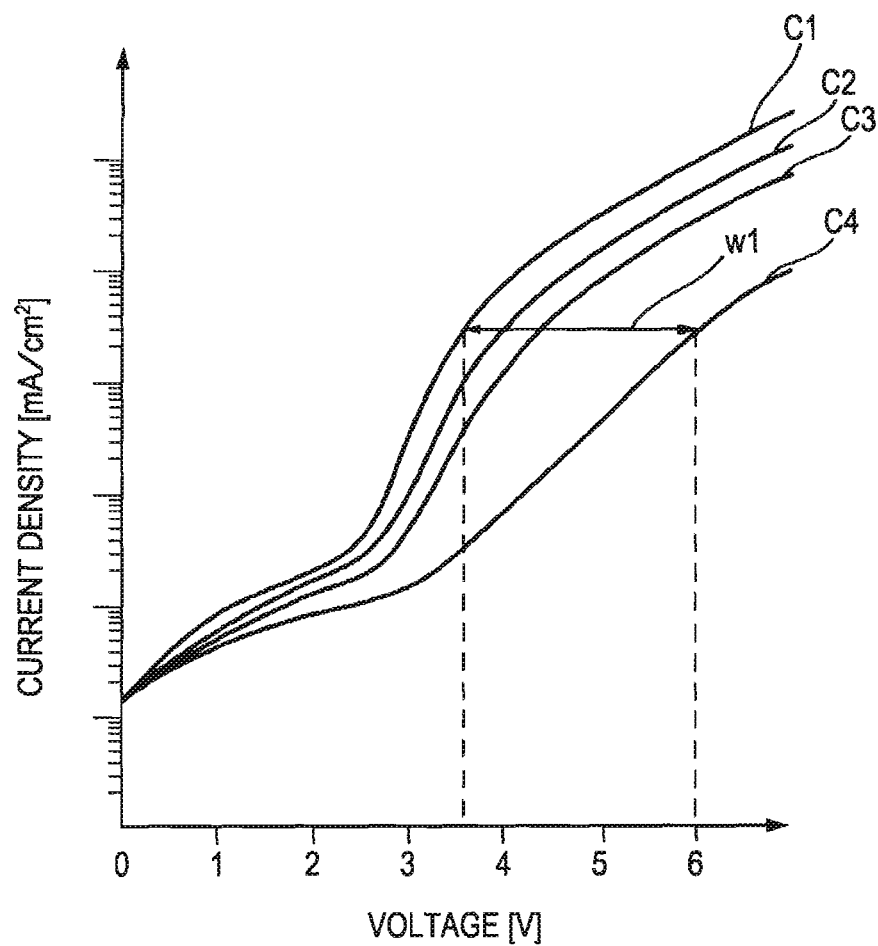
FIG. 6 is a graph that shows temperature characteristics of an organic EL material.

The operation of the organic EL device according to the first embodiment will now be described with reference to FIGS. 5 and 6. FIG. 5 is a block diagram illustrating a method for driving the organic EL device according to the first embodiment. FIG. 6 is a graph that shows temperature characteristics of an organic EL material.

Referring to FIG. 5, when the organic EL device 10 is in operation, the current detecting circuit 190 detects a value of an electric current flowing through each organic EL element 82GT included in the corresponding temperature-detection pixel 80 at, for example, predetermined time intervals. The current detecting circuit 190 then outputs the detected current value to the drive-waveform controlling circuit 170.

As described above, the organic EL elements 82GT are provided in the subpixels 81G of the temperature-detection pixels 80 and are optically shielded by the light shielding layers 801. The organic EL elements 82GT are electrically connected to the current detecting circuit 190. As will be described below, in the first embodiment, the temperature-detection pixels 80 are located at a plurality of positions within the image display area 110.

The aforementioned current value is detected by the current detecting circuit 190 when a drive voltage is applied to each of the organic EL elements 82GT. In this case, even though the organic EL layers 50 included in the organic EL elements 82GT emit light, the light is blocked by the light shielding layers 801, or in other words, the sections with the organic EL elements 82GT are non-light-emitting pixel sections. Accordingly, the light from the organic EL layers 50 has substantially no adverse effect or preferably has absolutely no adverse effect on the display in the image display area 110.

As a modification example of the first embodiment, the electric current detection may be implemented by applying a predetermined voltage to each organic EL element 82GT for a specific time period. In this case, a stable current can be supplied to each organic EL element 82GT, whereby the current detection can be implemented with high accuracy.

The drive-waveform controlling circuit 170 calculates the temperatures of the organic EL elements 82GT on the basis of the current values from the current detecting circuit 190. Based on the calculated temperatures, the drive-waveform controlling circuit 170 generates correction data used for correcting a drive waveform to achieve a desired brightness. The drive-waveform controlling circuit 170 then outputs the correction data to the data-line drive circuit 150.

Referring to FIG. 6, the organic EL material used for the organic EL layers 50 in the organic EL elements 72, 82, and 83 has a temperature characteristic in which its resistance decreases with increasing temperature whereas its resistance increases with decreasing temperature. Lines C1, C2, C3, and C4 in the graph of FIG. 6 show voltage-versus-current-density relationships when a voltage is applied to the organic EL material under specific temperature conditions of 80° C., 50° C., 25° C., and −30° C., respectively. For example, under the same applied voltage, the current density decreases with decreasing temperature, namely, the current density decreases in the order: C1, C2, C3, and C4. In other words, in order to produce the same current density in the organic EL material, the applied voltage must be increased with decreasing temperature, namely, the applied voltage must be increased in the order: C1, C2, C3, and C4. For example, as indicated by a difference W1 shown in FIG. 6, in order to produce a predetermined current density, a voltage of about 3.5 V is required at 80° C. (see line C1) while a voltage of about 6 V is required at −30° C. (see line C4). In other words, a required voltage difference with respect to a temperature difference of about 110° C. is about 2.5 V. This implies that an amount of voltage change per unit temperature required for applying a predetermined current is 23 mV/° C. Since the organic EL material has such a relatively large temperature characteristic (i.e. a temperature characteristic of 5 mV/° C. or higher), an organic EL element having an organic EL layer composed of such an organic EL material can function as a temperature sensor. In other words, the temperatures of the organic EL elements 82GT can be calculated from the voltage applied to the organic EL elements 82GT included in the temperature-detection pixels 80 and the current values of the organic EL elements 82GT detected by the current detecting circuit 190.

As mentioned above, the drive-waveform controlling circuit 170 generates correction data used for correcting a drive waveform to achieve a desired brightness on the basis of the temperatures calculated in the above-described manner. Here, "correction data" is used for changing a parameter of the drive waveform, such as the width, height, shape, or inrush current shape of the drive waveform, so that there is only a small difference between a drive waveform determined in correspondence to a preset temperature and a drive waveform determined in correspondence to a calculated temperature. For example, the correction data is used for reducing (or correcting) a difference between an applied current required for allowing the organic EL layers 50 to emit light with a desired luminance at a preset temperature and an applied current required for allowing the organic EL layers 50 to emit light with a desired luminance at a detected temperature.

The data-line drove circuit 150 generates a drive waveform for driving the pixels 70 on the basis of the correction data and display data from the drive-waveform controlling circuit 170, and sends the generated drive waveform to the pixels 70 via the data lines 114. Consequently, the organic EL elements 72 receive an applied current of the drive waveform that corresponds to the detected temperatures. In other words, the current values of the organic EL elements 82GT are fed back to the drive-waveform controlling circuit 170 so that the organic EL elements 72 can receive the applied current of the drive waveform that is adjusted in accordance with the temperatures of the organic EL elements 82GT (that is, the temperature of the organic EL elements 72 which can be easily estimated from the current values). Consequently, the luminance of the pixels 70 can be controlled to a desired level regardless of heat generated when the organic EL elements 72 emit light or a temperature change in the organic EL elements 72 as a result of heat generated by the TFTs 74 and 76.

As described above, in the first embodiment; the temperatures of the organic EL elements 82GT (or in other words, the temperature of the pixels 70 on the substrate 1) are detected by utilizing the temperature characteristic of the organic EL elements 82GT included in the temperature-detection pixels 80 (more specifically, the subpixels 81G) in the image display area 110. Therefore, unlike a case where the temperature of the pixels 70 (or the organic EL elements 72) is detected by, for example, a temperature sensor disposed in an area other than the image display area 110, the first embodiment allows for the detection of the temperature of the pixels 70 in areas much closer to the pixels 70. Accordingly, the temperature of the pixels 70 can be detected with higher accuracy.

Although the current detecting circuit 190 for detecting the current values of the organic EL elements 82GT is provided separate from the drive-waveform controlling circuit 170 in the first embodiment, the current values of the organic EL elements 82GT may alternatively be detected by the drive-waveform controlling circuit 170. Furthermore, in the first embodiment, although the current detecting circuit 190 detects the current values of the organic EL elements 82GT, and the drive-waveform controlling circuit 170 calculates the temperatures on the basis of the detected current values, a temperature detecting circuit may alternatively be provided such that the temperature detecting circuit may detect the current values of the organic EL elements 82GT and calculate the temperatures on the basis of the detected current values.

In addition, referring to FIG. 3, of the plurality of pixels 70 that include the organic EL elements 72 serving as display light-emitting elements, some of the pixels 70 that are to function as temperature sensors are given the light shielding layers 801 so as to provide the temperature-detection pixels 80 having the organic EL elements 82GT. Thus, the first embodiment substantially does not require a complicated manufacturing process.

Figure 7:
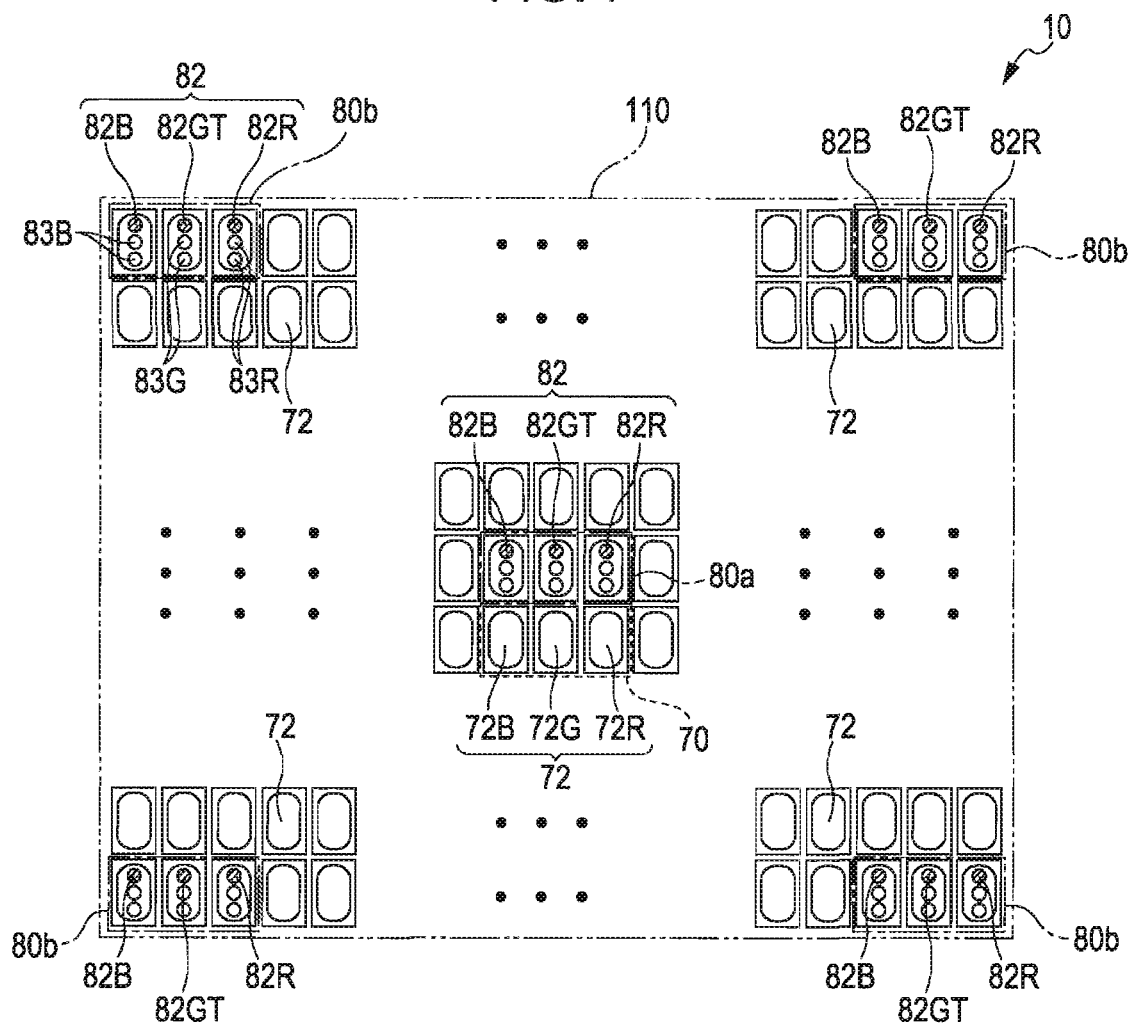
FIG. 7 is a plan view showing the locations of temperature-detection pixels in an image display area according to the first embodiment.

The locations of the temperature-detection pixels 80 in the image display area 110 will now be described with reference to FIGS. 5 and 7. FIG. 7 is a plan view showing the locations of the temperature-detection pixels 80 in the image display area 110 according to the first embodiment.

Referring to FIG. 7, in the first embodiment, the temperature-detection pixels 80 are located in the central section and periphery sections of the image display area 110. Specifically, the organic EL device 10 has a temperature-detection pixel 80a in the central section of the image display area 110 and four temperature-detection pixels 80b in the periphery sections of the image display area 110. Accordingly, the temperature distribution in the image display area 110 can be calculated.

As shown in FIG. 7, the subpixels 81 constituting the temperature-detection pixels 80 include the organic EL elements 83 serving as light-emitting elements in addition to the organic EL elements 82. Specifically, each subpixel 81R includes an organic EL element 82R serving as a non-light-emitting pixel section and organic EL elements 83R serving as light-emitting pixel sections. In the first embodiment, two organic EL elements 83R are included in each subpixel 81R. Likewise, each subpixel 81G includes an organic EL element 82GT serving as a non-light-emitting pixel section and organic EL elements 53G serving as light-emitting pixel sections. In the first embodiment, two organic EL elements 83G are included in each subpixel 81G. Similarly, each subpixel 81B includes an organic EL element 82B serving as a non-light-emitting pixel section and organic EL elements 83B serving as light-emitting pixel sections. In the first embodiment, two organic EL elements 83B are included in each subpixel 81B. The shaded sections in FIG. 7 indicate that the organic EL elements 82B, 82GT, and 82R are optically shielded by the light shielding layers 801. Consequently, each temperature-detection pixel 80 has non-light-emitting pixel sections (i.e. sections where the organic EL elements 82R, 82G, and 82B are disposed) and light-emitting pixel sections (i.e. sections where the organic EL elements 83R, 83G, and 83B are disposed). This substantially or entirely prevents the occurrence of missing pixels that may be caused by non-light-emitting pixel sections. In other words, since the organic EL elements 83R, 83G, and 83B in each temperature-detection pixel 80 emit light, the temperature-detection pixel 80 functions as a light-emitting pixel as a whole.

Alternatively, the organic EL elements 83 may be omitted such that the subpixels 81 constituting the temperature-detection pixels 80 include only the organic EL elements 82. In that case, the temperature-detection pixels 80 can be manufactured more easily.

Referring to FIGS. 5 and 7, when the organic EL device according to the first embodiment is in operation, the current detecting circuit 190 detects the current value of the organic EL element 82GT included in each of the temperature-detection pixels 80a and 80b, and the drive-waveform controlling circuit 170 calculates the temperature of the organic EL element 820T included in each of the temperature-detection pixels 80a and 80b. In other words, the temperature of the organic EL element 82GT located in the central section of the image display area 110 is calculated, and the temperatures of the organic EL elements 82GT located in the four periphery sections of the image display area 110 are calculated. Thus, the temperature distribution of the plurality of pixels 70 in the image display area 110 can be calculated. Accordingly, the drive-waveform controlling circuit 170 can correct the drive waveform to be applied to the pixels 70 in accordance with the temperature distribution of the pixels 70, thereby reducing or preventing brightness variation in the image display area 110, which can occur depending on the temperature distribution of the pixels 70. Especially in a case where the image display area 110 is wide (that is, the substrate 1 and the sealing plate 20 are large in size, or the luminescence panel is large in size), the temperature distribution of the pixels 70 may easily tend to become uneven, leading to brightness variation in the image display area 110. Therefore, correcting the drive waveform in accordance with the temperature distribution of the pixels 70 calculated on the basis of the current values of the organic EL elements 82GT is significantly effective.

As described above, in the organic EL device according to the first embodiment, the temperatures of the organic EL elements 82GT serving as temperature-detection light-emitting elements provided in the image display area 110 are detected, and an electric current corrected in accordance with the detected temperatures are supplied to the organic EL elements 72 serving as display light-emitting elements. This allows for high-quality image display. In particular, the drive-waveform controlling circuit 170 works together with the current detecting circuit 190 to detect the temperatures of the organic EL elements 82GT by utilizing the temperature characteristics of the organic EL elements 82GT provided in the image display area 110, thereby allowing for temperature detection within the image display area 110 and substantially not requiring a complicated manufacturing process.

Second Embodiment

Figure 8:
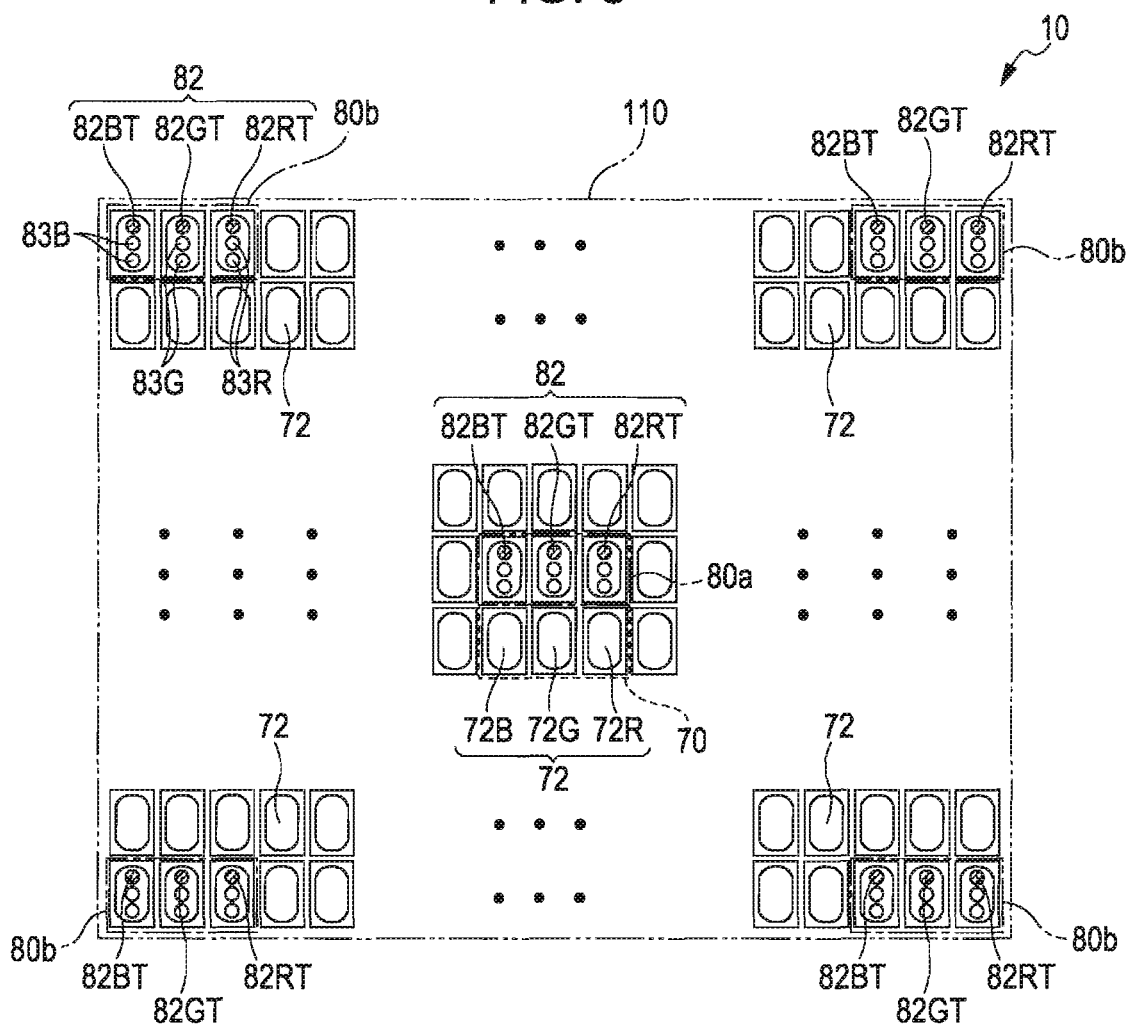
FIG. 8 is a plan view which illustrates a second embodiment and corresponds to the plan view in FIG. 7.
Figure 9:
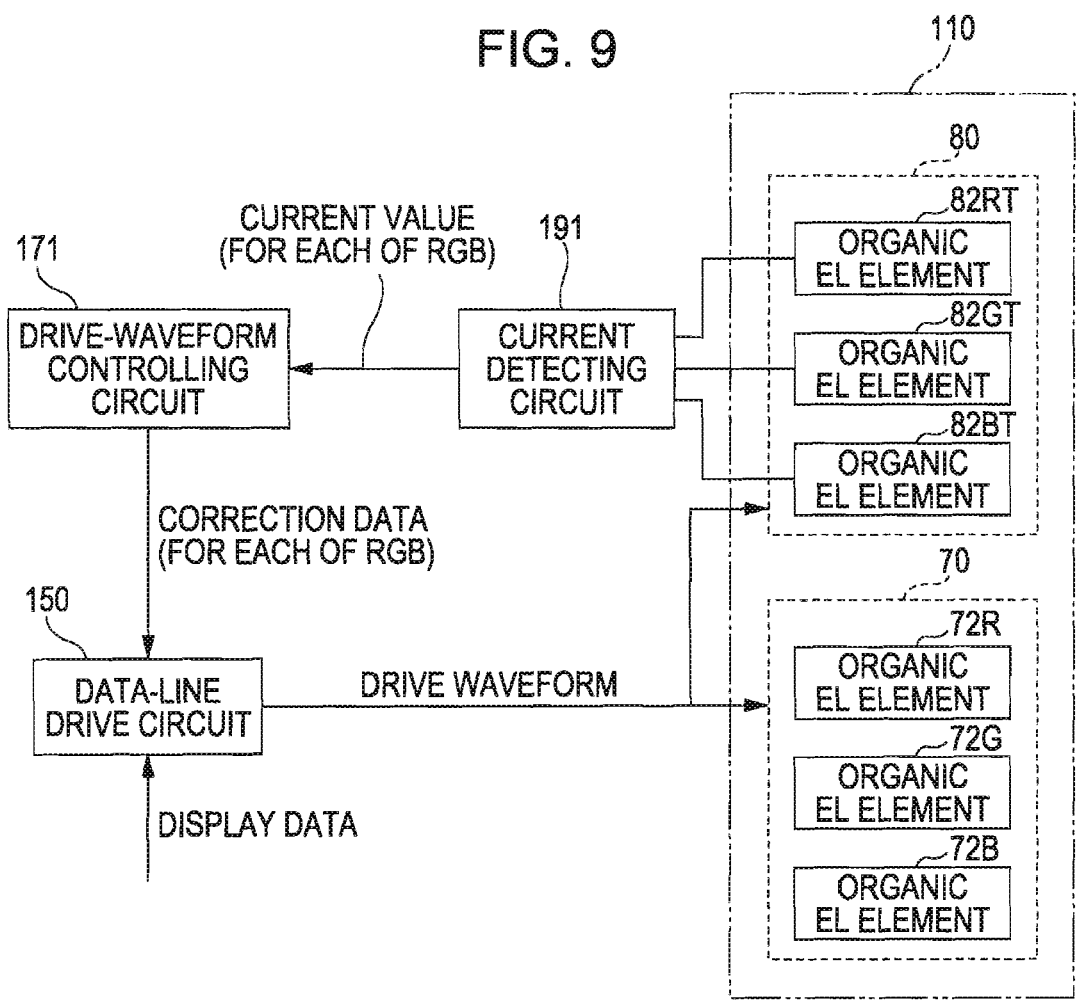
FIG. 9 is a block diagram which illustrates the second embodiment and corresponds to the plan view in FIG. 5.

An organic EL device and a method for driving the device according to a second embodiment of the invention will be described below with reference to FIGS. 8 and 9. FIG. 8 is a plan view which illustrates the second embodiment and corresponds to the plan view in FIG. 7. FIG. 9 is a block diagram which illustrates the second embodiment and corresponds to the plan view in FIG. 5. In FIGS. 8 and 9, components equivalent to those in the first embodiment shown in FIGS. 1 to 7 are indicated by the same reference numerals, and descriptions of those components will thus be omitted.

In contrast to the first embodiment in which only the organic EL elements 82GT included in the temperature-detection pixels 80 function as temperature sensors, the subpixels 81R, 81G, and 81B constituting the temperature-detection pixels 80 (i.e. the temperature-detection pixels 80a and 80b) in the second embodiment shown in FIG. 8 have organic EL elements 82RT, 82GT, and 82BT that function as temperature sensors.

The organic EL elements 82RT, 82GT, and 82BT respectively have the same configurations as the organic EL elements 82R, 82GT, and 82B in the first embodiment.

Furthermore, referring to FIG. 9, the organic EL device 10 according to the second embodiment is provided with a current detecting circuit 191 and a drive-waveform controlling circuit 171 in place of the current detecting circuit 190 and the drive-waveform controlling circuit 170 in the first embodiment.

The current detecting circuit 191 detects the current values of the organic EL elements 82RT, 82GT, and 82BT included in each temperature-detection pixel 80 at, for example, predetermined time intervals. The current detecting circuit 191 then outputs the detected current values of R, G, and B to the drive-waveform controlling circuit 171.

Based on the current values of R, G, and B from the current detecting circuit 191, the drive-waveform controlling circuit 171 calculates the temperatures of the organic EL elements 82RT, 82GT, and 82BT. Based on the calculated temperatures, the drive-waveform controlling circuit 171 generates correction data used for correcting drive waveforms for R, G, and B so as to achieve a desired brightness. The correction data is then output to the data-line drive circuit 150.

Accordingly, when the device is in operation, the current detecting circuit 191 detects the current values of the organic EL elements 82RT, 82GT, and 82BT that are composed of different organic EL materials. Subsequently, based on the current values of R, G, and B, the drive-waveform controlling circuit 171 calculates the temperatures of the R, G, and B organic EL elements 82, and generates correction data for correcting the drive waveforms for the organic EL elements 82RT, 82GT, and 82BT. Finally, the data-line drive circuit 150 applies electric currents of the corrected RGB drive waveforms to the organic EL elements 72R, 72G, and 72B. Accordingly, this reduces or prevents color shifts that can occur from differences in temperature among light-emitting pixels in the central and periphery sections of a panel of an RGB independent emission system. Specifically, the temperatures of the ROB pixels are detected accurately and are fed back for the calculation of currents to be applied to the RGB pixels so that color shifts resulting from temperature differences can be further reduced or prevented.

Electronic Apparatus

The following description is directed to examples of electronic apparatuses to which the organic EL device according to the first or second embodiment can be applied.

Figure 10:
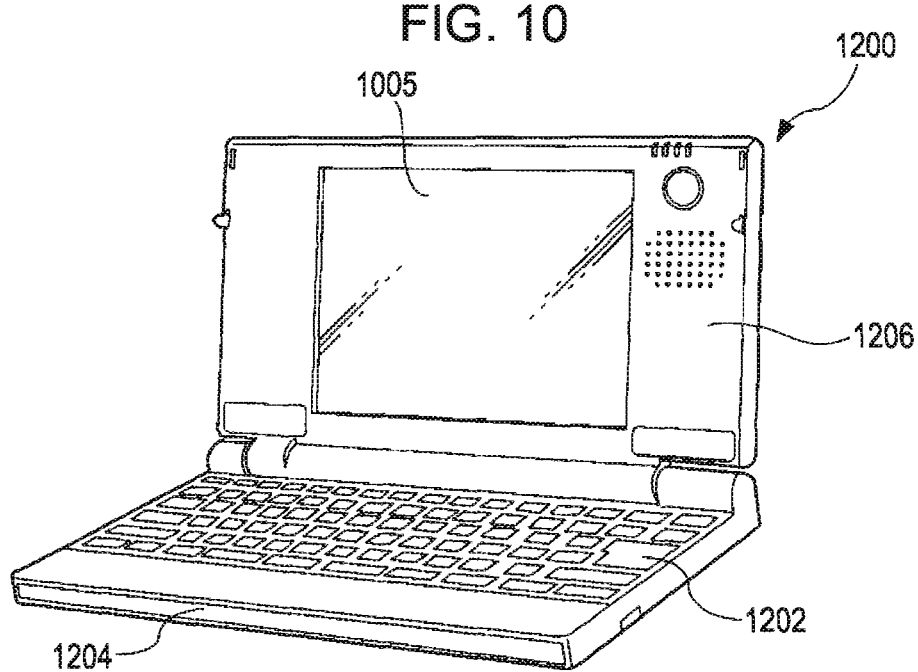
FIG. 10 is a perspective view of a personal computer, which is an example of an electronic apparatus equipped with the organic EL device according to the first or second embodiment.

One example is a mobile personal computer equipped the organic EL device. FIG. 10 is a perspective view of the personal computer. As shown in FIG. 10, a computer 1200 includes a main body 1204 equipped with a keyboard 1202, and a display unit 1206 having a display portion 1005 equipped with the organic EL device.

Figure 11:
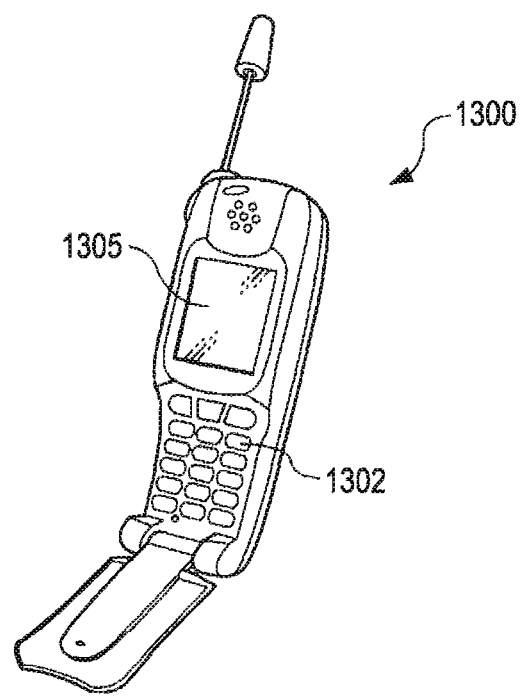
FIG. 11 is a perspective view of a portable telephones which is an example of an electronic apparatus equipped with the organic EL device according to the first or second embodiment.

Another example is a portable telephone equipped with the organic EL device. FIG. 11 is a perspective view of the portable telephone. As shown in FIG. 11, a portable telephone 1300 includes a plurality of operating buttons 1302 and a display portion 1305 equipped with the organic EL device.

Other examples of apparatuses to which the organic EL device can be applied include notebook personal computers, personal digital assistants (PDAs), televisions, viewfinder-type or monitor-direct-view-type video tape recorders, car navigation systems, pagers, electronic notepads, calculators, word processors, workstations, point-of-sale (POS) terminals, touch panels, and image formation apparatuses equipped with the organic EL device as an exposure head, such as printers, copiers, and facsimile apparatuses.

The invention is not limited to the above embodiments, and modifications are permissible within the scope and spirit of the invention as interpreted from the following claims and the entire specification or without departing from the scope and spirit of the invention. In that case, a light-emitting device, a method for driving the device, and an electronic apparatus equipped with the device that are associated with such modifications are included within the technical scope of the invention.

What is claimed is:

1. A light-emitting device comprising:
    a substrate that has a display area and a peripheral area positioned outside of the display area;
    a plurality of displaying pixels, disposed in the display area, and a plurality of temperature-detection pixels, disposed in the peripheral area and a center area of the display area, each pixel comprising a first electrode, a second electrode, and including an organic electroluminescent layer which includes organic material and is disposed between the first electrode and the second electrode, wherein the plurality of displaying pixels display information and the plurality of temperature-detection pixels further comprise a light shielding layer that is directly disposed between the first electrode and the organic electroluminescent layer to prevent the temperature-detection pixels to display information;
    a temperature detector that is disposed on the substrate in the peripheral area and detects a current value of the temperature-detection pixels so as to detect the temperature of each respective temperature-detection pixel, the temperature detector being coupled with the temperature-detection pixels;
    an applied-current calculator that is disposed above the substrate in the peripheral area and calculates an electric current to be applied to the display light-emitting element in accordance with the temperature detected by the temperature detector so that the display light-emitting element emits a light with a predetermined luminance; and
    a current applying unit that is disposed above the substrate in the peripheral area and applies the electric current to the display light-emitting element.

2. The light-emitting device according to claim 1, wherein the display light-emitting element include three kinds of display light-emitting elements respectively having three kinds of first organic electroluminescent layers that emit red, green, and blue light rays,
    wherein the temperature-detection pixels include three kinds of temperature-detection pixels respectively having three kinds of second organic electroluminescent layers that are the same as the three kinds of first-organic electroluminescent layers included in the three kinds of display light-emitting elements,
    wherein the temperature detector detects the temperature of each of the three kinds of temperature-detection pixels, and
    wherein the applied-current calculator calculates the electric current to be applied to each of the three kinds of display light-emitting elements.

3. The light-emitting device according to claim 1, wherein the temperature-detection pixels contain an organic material having a temperature characteristic of 5 mV/° C. or higher.

4. The light-emitting device according to claim 1, wherein the temperature detector detects the current value of the temperature-detection pixels by applying a predetermined voltage thereto.

5. An electronic apparatus comprising the light-emitting device according to claim 1.

6. The light-emitting device according to claim 1, the temperature-detection pixels only being arranged at a plurality of predetermined locations at the center region and the peripheral area of the display area.

7. The light-emitting device according to claim 6, the temperature-detection pixels only being arranged at the center region and each corner of the peripheral area of the display area.

8. A method for driving a light-emitting device that includes a substrate that has a display area and a peripheral area positioned outside of the display area;
    a plurality of displaying pixels, disposed in the display area, and a plurality of temperature-detection pixels, disposed in the peripheral area and a center area of the display area, each pixel comprising a first electrode, a second electrode, and including an organic electroluminescent layer which includes organic material and is disposed between the first electrode and the second electrode, wherein the plurality of displaying pixels display information and the plurality of temperature-detection pixels further comprise a light shielding layer that is directly disposed between the first electrode and the organic electroluminescent layer to prevent the temperature-detection pixels to display information; the method comprising:

respectively detecting a current value of each of the temperature-detection pixels so as to detect the temperature of each respective the temperature-detection pixel;

calculating an electric current to be applied to the display light-emitting element in accordance with the detected temperature so that the display light-emitting element emits light with a predetermined luminance; and applying the electric current to the display light-emitting element.

* * * * *